United States Patent
Nanis

(10) Patent No.: US 8,871,143 B2
(45) Date of Patent: Oct. 28, 2014

(54) AMALGAM METHOD FOR FORMING A SPUTTER TARGET USEFUL IN THE MANUFACTURE OF THIN-FILM SOLAR PHOTOVOLTAIC CELLS

(71) Applicant: Leonard Nanis, San Jose, CA (US)

(72) Inventor: Leonard Nanis, San Jose, CA (US)

(\*) Notice: Subject to any disclaimer, the term of this patent is extended or adjusted under 35 U.S.C. 154(b) by 0 days.

(21) Appl. No.: 13/722,436

(22) Filed: Dec. 20, 2012

(65) Prior Publication Data

US 2013/0186745 A1 Jul. 25, 2013

Related U.S. Application Data

(60) Provisional application No. 61/589,249, filed on Jan. 20, 2012.

(51) Int. Cl.
| | | |
|---|---|---|
| *C22C 1/06* | (2006.01) | |
| *B22D 23/00* | (2006.01) | |
| *C23C 14/14* | (2006.01) | |
| *C23C 14/34* | (2006.01) | |
| *B22D 23/02* | (2006.01) | |

(52) U.S. Cl.
CPC ............... *B22D 23/00* (2013.01); *C23C 14/14* (2013.01); *C23C 14/3414* (2013.01); *B22D 23/02* (2013.01)
USPC .................. 419/46; 419/66; 419/61; 419/32; 148/538; 204/192.15; 164/47; 164/76.1

(58) Field of Classification Search
CPC .................................................... C23C 14/3414
USPC .................................................. 419/61, 5, 46
See application file for complete search history.

(56) References Cited

U.S. PATENT DOCUMENTS

| | | | |
|---|---|---|---|
| 3,141,238 A * | 7/1964 | Harman, Jr. ............... 228/248.1 |
| 3,839,780 A * | 10/1974 | Freedman et al. ............ 228/249 |
| 4,398,975 A * | 8/1983 | Ohsawa et al. .............. 148/400 |
| 5,653,856 A * | 8/1997 | Ivanov et al. ............ 204/192.12 |
| 5,672,913 A | 9/1997 | Baldwin et al. |
| 6,214,177 B1 * | 4/2001 | Runkle ..................... 204/192.15 |
| 6,518,086 B2 | 2/2003 | Beck et al. |
| 6,554,923 B2 | 4/2003 | Bhattacharya et al. |
| 6,709,557 B1 | 3/2004 | Kailasam et al. |
| 7,544,884 B2 * | 6/2009 | Hollars ......................... 136/256 |
| 7,935,558 B1 | 5/2011 | Juliano et al. |
| 8,048,707 B1 | 11/2011 | Shufflebotham et al. |
| 2008/0121137 A1 | 5/2008 | van Osten et al. |
| 2010/0116341 A1 | 5/2010 | Huang et al. |
| 2010/0206724 A1 | 8/2010 | Takahashi |
| 2011/0089030 A1 | 4/2011 | Juliano et al. |
| 2013/0192986 A1 * | 8/2013 | Morimoto et al. ....... 204/298.13 |

FOREIGN PATENT DOCUMENTS

| | | |
|---|---|---|
| KR | 20110019466 A | 2/2011 |
| WO | 2011058828 A1 | 5/2011 |

OTHER PUBLICATIONS

May 14, 2013 International Search Report for PCT/US2013/021985 9 pp.
Anders, A., Thin Solid Films, vol. 518, issue 15, 2010, May 31, 2010, pp. 487-490.
Chapman, B., Glow Discharge Processes, Wiley 1980, ISBN 0-471-07828-X, Chap.6, pp. 177-194.
Kulikova, T.V. et al., Defect and Diffusion Forum, vols. 326-328 Diffusion in Solids and Liquids VII, Apr. 26, 2012, pp. 227-232.
S.M.Dunne, R. Abraham, C.L. Pankhurst , British Dental Journal, vol. 198 No. 6 (Mar. 2005) p. 355-359.
Vossen, J.L., et al. Thin Film Processes, Academic Press, ISBN 0127282505, Section V-A, 1978, p. 41-45.

\* cited by examiner

*Primary Examiner* — Jessee Roe
*Assistant Examiner* — Christopher Kessler
(74) *Attorney, Agent, or Firm* — Haynes Beffel & Wolfeld LLP

(57) ABSTRACT

Hardened amalgams formed from copper mixed with liquid gallium or liquid gallium-indium alloys are used to fabricate sputter targets comprised of copper, gallium and indium (CIG) and targets of selenides of copper, gallium and indium (CIGS). Amalgam hardening occurs by formation of intermetallic compounds at or near ambient temperature as a result of reaction between liquid metals and solid metals in powder form.

17 Claims, 9 Drawing Sheets

Fig.9 EXAMPLE 1, 1000 X

| EDS AREA | EDS ATOM PERCENT | |
|---|---|---|
| | COPPER | GALLIUM |
| 1 | 37.790 | 61.700 |
| 2 | 33.199 | 66.307 |
| 3 | 32.999 | 66.540 |

AMALGAM METHOD FOR FORMING A SPUTTER TARGET USEFUL IN THE MANUFACTURE OF THIN-FILM SOLAR PHOTOVOLTAIC CELLS

RELATED APPLICATIONS

This application claims the benefit of U.S. Provisional Patent Application No. 61/589,249 filed on 20 Jan. 2010.

FIELD OF THE INVENTION

The present invention is related generally to the preparation of sputter target materials suitable for depositing thin film layers and more particularly to preparing sputter targets comprised of thin metal and compound films which constitute the absorber and other layers useful in manufacturing photovoltaic solar cells comprised of stacked thin film layers.

BACKGROUND

Photovoltaic Solar Cells Convert Sunlight to Electricity

The energy in sunlight can induce changes in the distribution of electrons in certain semiconductor compounds. The radiant energy that penetrates into the crystalline structure of the semiconductor can activate electrons to jump from their normal orbits around atoms of the compound to become mobile and capable of carrying electrical current. Energy suitable for raising the energy of electrons from the compound is found at the shorter wave length blue-violet end of the solar spectrum.

Attention has been focused on thin film solar cells with the increasing global emphasis on solar photovoltaic methods as an alternative renewable source of electrical energy. Multilayer thin-film cells offer the potential advantage of recovering 20 percent of the sun's energy that shines on the solar cell, an efficiency significantly greater than the 12% of conventional silicon based cells. The greater efficiency of thin film solar cells is a distinct advantage in terms of area requirements for a solar cell array.

A leading candidate to replace the conventional silicon solar cell is a multi-layer stack of thin films containing a critical absorber layer comprised of elements from groups in the periodic table known as IB, IIIA and VIA. The absorber layer is a key location where incoming sunlight generates electrical energy. CIGS, the most notable of these IB-IIIA-VIA absorber layers, contains copper as the IB metal, indium and gallium as IIIA metals and selenium as the VIA element. The CIG metals copper, indium and gallium combine with selenium to form selenide compounds. The CIGS selenide compounds are semiconductors, also known as mixed metal chalcogenides. When the radiant energy in the sunlight is absorbed in the CIGS layer, negatively charged electrons and positively charged holes are produced which provides a voltage difference that can be harnessed as electrical energy.

Typical chalcogenide compounds used in thin film solar cells are copper gallium diselenide, $CuGaSe_2$, and copper indium diselenide, $CuInSe_2$. The combined mixture of copper, indium, and gallium with selenium can be a ternary selenide with a variable composition where gallium can substitute for part of the indium. The ternary selenide is represented by the formula:

$$CuIn_{(1-x)}Ga_{(x)}Se_2 \text{ where } 0<x<1 \qquad \text{Eqn 1}$$

Recent advances in thin film cell technology find beneficial improvements in cell efficiency when some of the selenium is replaced by sulfur and also when sodium and aluminum are incorporated in the chalcogenide absorber structure. However, in the interests of simplicity, we may represent the general composition as given in Eqn 1.

Silicon Solar Cells

Silicon solar cells dominate the photovoltaic market. Silicon originally developed for semiconductor integrated circuits is also suitable for photovoltaic use. Methods used for modifying the chemistry of semiconductor silicon (doping) are also used for solar cells. Silicon solar cell manufacture thus has a supply base of materials and methods from well-established mature industries. Many variations of silicon cells have been developed to bring costs down and worldwide capacity for silicon has grown. Sunlight to electricity efficiencies of production cells are typically about 12% for single crystal silicon wafer substrates. Substrate wafers are pure silicon grown in ingots which are sliced by a wire saw and then polished in the same manner as for integrated circuit fabrication. In forming a solar cell, the near surface region of the silicon wafer is implanted with an element that creates a junction where electrons and holes produced by the energy of incoming solar radiation are separated. It is noted that holes are positively charged because of a local deficiency of electrons. The voltage difference across the internal junction provides current flow in an external circuit as long as light shines on the surface. The silicon cell accomplishes energy conversion within a single material although two chemically different regions are involved. The implanted surface layer is typically 3000 Angstroms (0.3 micron) deep whereas the total wafer thickness is about 300 micron.

As mentioned, silicon solar cells dominate the photovoltaic market yet the much greater 20% efficiency of thin film CIGS cells is a challenge to silicon and a driving force for capture of a share of the market. Some of the disadvantages of silicon are that it is a brittle material and cannot be fitted to curved surfaces or used in a reel-to-reel method. Also, the wire sawing of wafers from an ingot wastes carefully grown very pure material. These limitations have led to innovations such as polycrystalline and ribbon substrates which potentially drive the cost of silicon cells down further. There is no doubt that silicon is ahead, yet the manufacture of CIGS cells has slowly improved. Several different coating methods have been tried with moderate success but continuous in-line sputtering is recognized as a path for reducing manufacturing costs. The present invention concerns sputtering of the CIGS layer in the CIGS cell stack by using a novel amalgam technique to fabricate this important layer.

Thin Film Solar Cells

The present invention is an improved method for forming the CIG or CIGS layer in a thin film cell stack. FIG. 1 is a cut away schematic representation of important layers in a thin film stack. Sunlight enters top layer 14, which plays two roles. It is transparent and also electrically conductive to serve as an electrical terminal of the cell stack. Materials used for 14 include indium tin oxide (ITO) and also zinc oxide containing some aluminum oxide ($ZnO+Al_2O_3$). Current in layer 14 is collected by a metallic grid, schematically represented by 15. The grid elements are spaced apart so there is minimal blocking of light entering 14. Layer 14 is usually coated with an anti-reflective layer (not shown in FIG. 1), typically sputtered calcium fluoride ($CaF_2$), so that light hitting the top of the cell is not scattered and prevented from entering the stack. Layer 13 is known as the buffer layer and is typically zinc sulfide (ZnS) or also cadmium sulfide (CdS). The interface between layer 13 and layer 11 serves as the junction which separates positive and negative charge. Layer 11 is the CIGS ternary chalcogenide absorber which sits in contact with metal current collector 12. Layer 12 is frequently sputtered molybdenum on a stainless steel substrate but 12 may also be considered as a sputtered molybdenum current collector on top of a glass substrate. A substrate layer in FIG. 1 is not shown for clarity. In total, there can be six separate layers in the CIGS stack which typically has a total thickness of about 2.5 micron.

Sputtering can be used for deposition of layers 11,12,13 and 14 plus the anti-reflection topmost layer. Accordingly, sputtering details are discussed in the following section to relate terminology to the present invention.

Sputtering

Sputtering is uniquely suited as a means for controlled and reproducible deposition of thin films on an atom-by-atom basis. Also known as vacuum sputtering or physical vapor deposition (PVD), sputtering has many applications in the fabrication of integrated circuits, magnetic memory disks used in computers, and architectural window glass coatings, to name but a few. In addition to thin metal layers, insulators such as aluminum oxide can also be deposited using power supplied at high frequency.

Sputtering takes place in a vacuum chamber. A small amount of inert argon gas added to the vacuum is ionized by electrical power applied between two electrodes. For direct current sputtering, the negative polarity electrode, known as the target, is made of the material to be sputtered. The substrate to be coated is maintained at a positive potential. The argon gas in the space between electrodes becomes ionized by the applied potential with electrons being stripped away from the argon atom. The ionized argon atom now has a positive charge and is immediately accelerated toward the negatively charged target. When the argon ion smashes into the target, it transfers some of its energy to the target material and knocks target atoms loose. The loosened atoms are ejected from the target and enter the vacuum space, landing on the substrate to build a deposit layer with the transferred atoms. Details of the mechanism of sputtering may be found in texts on plasma physics such as "Glow Discharge Processes" by Chapman [Glow Discharge Processes, B. Chapman, Wiley 1980, ISBN 0-471-07828-X, Chap. 6, pp 177-194, herewith added as reference] and in texts on thin films such as "Thin Film Processes" by Vossen [Thin Film Processes, J. L. Vossen and W. Kern, Academic Press, ISBN 0127282505, Section V-A p 41, herewith added as reference]

The target material is usually solder-bonded to a backing plate which is outfitted with power connections and internal channels for forced water cooling to dissipate the heat generated by the sputter process. In addition to the target and backing plate, the basic components of a sputtering system are the enclosing vacuum chamber, pumps to maintain vacuum in the chamber, argon gas flow controls, power supply and coolant refrigeration. Targets are replaced when sufficient material has been sputtered to form an uneven wear path. Utilization of target material may be only 50% for magnetron sputtering with a planar target backed by magnets to shape the ionization region in the argon plasma. Rotating cylindrical targets have been introduced to make a more even distribution of wear to increase material utilization. The present invention of amalgam CIG and CIGS target material is adaptable to both planar and cylindrical designs. The present invention is also suitable for refurbishment of targets taken out of service because of excessive wear.

In-line sputter systems fed continuously with substrates offer a path for high volume production of solar panels with associated benefit of cost reduction. Substrates up to one meter in width (or greater) can be fed to an in-line system to pass by stations where each of the thin film layers of the CIGS stack are added in sequence. A continuous roll-to-roll metal sheet substrate can move past the sputter stations with multiple targets of the same type where a thicker deposit is needed. A readily controllable sputtering rate at each station permits close control of layer thickness and provides for good adhesion between layers to promote bonding of materials with different thermal expansion characteristics. Cost reduction for manufacture of thin-film CIGS solar cells may be anticipated for a sputtering method by introducing the present invention of amalgam CIGS targets.

DESCRIPTION OF THE PRIOR ART

Bringing CIGS out of the research laboratory to produce high efficiency solar cells in a high volume industrial setting has been the goal of many workers. As an example, the work reported by Noufi and Beck in U.S. Pat. No. 6,518,086 [herewith incorporated as a reference] reviews the advantages and disadvantages of several methods used to prepare CIGS absorber layers. The improvement recommended by Noufi and Beck is a two-stage method wherein the ingredients of separate chalcogenide layers are first deposited as precursors on an unheated substrate followed by a second step in which the precursors are heated in a selenium-bearing atmosphere to blend the separate layers into the desired ternary chalcogenide composition. U.S. Pat. No. 6,518,086 is representative of the current trend in the CIGS solar cell industry and is herewith considered in more detail for contrast with the advantages of the present invention.

The application of U.S. Pat. No. 6,518,086 requires close attention to the chemistry and deposited thickness of each of the separately added layers in order to achieve the desired overall composition. Further, U.S. Pat. No. 6,518,086 requires the use of sputtering from multiple targets plus simultaneous thermal evaporation of selenium from an inert container in the same deposition chamber in order to achieve the desired chemistry of the CIGS absorber layer. During the first stage of the Noufi-Beck method described in U.S. Pat. No. 6,518,086, the chalcogenides are formed and deposited as a result of reaction between copper, indium and selenium.

Copper and indium are sputtered from separate targets in a near vacuum atmosphere in which a vapor pressure of selenium is maintained together with argon, the ionizable gas in the sputter system. When gallium is required, it is evaporated from a heated boat of liquid gallium maintained within the coating chamber. U.S. Pat. No. 6,518,086 also mentions the use of a gallium-copper sputter target as a simultaneous source of the two metals.

In the second stage of the Noufi-Beck method, the separately deposited precursor layers are blended by heating, preferably at temperatures in excess of 500° C. for 20 to 30 minutes in an atmosphere containing selenium vapor. The selenium can be provided by vaporizing pure elemental Se or from an atmosphere of hydrogen selenide, $H_2Se$, a highly toxic selenium-bearing gas. Special attention was given to the shielding of metal targets from the selenium-bearing gas to prevent selenization of the target surface and associated variable sputter rates.

It is noted that "manufacturability" is a general issue that must be addressed in bringing small-scale laboratory findings to a commercial scale to obtain the benefit of cost reduction associated with high volume production. In-line vacuum sputtering (also known as PVD—physical vapor deposition) is regarded as an ideal cost-saving method for high volume production of thin film devices, as in the reel-to-reel system described by Shufflebotham et al, in U.S. Pat. No. 8,048,707 (herewith incorporated as a reference). Substrates unrolled in a continuous sheet from a roll already in place within the vacuum chamber of a sputter system are moved past sputtering stations where several separate layers are added in succession. Separate substrate sheets may also be fed into an in-line vacuum system.

SUMMARY OF THE INVENTION

The present invention uses amalgam mixtures of CIG metals in which low melting gallium or liquid metal alloys of indium and gallium are mechanically mixed with solid copper metal powder. Upon mixing, the amalgam is initially a semi-liquid paste which gradually hardens. The term "amalgam" has usually been associated with mercury-silver alloys used in the practice of dentistry for filling cavities in teeth. However, we presently use the more general meaning of "amalgam" as a mixture formed between liquid metal which wets a solid metal, with the solid usually in a finely divided form.

A freshly formed amalgam mixture of CIG metals is a semi-liquid paste into which can be mixed powdered material to be included in the chemical composition of a sputter target. Powders of Group VI-A elements such as selenium or tellurium can be admixed into the metal amalgam paste to produce a target which can deliver all of the necessary ingredients to form a sputtered thin film of ternary chalcogenide such as CIGS. Other desirable materials such as sulfur and sodium may also be added to the chemistry of the target by incorporating powdered compounds containing these elements into the amalgam while it is in the paste form. Having all of the necessary absorber ingredients delivered to the substrate from one sputter target will simplify solar panel manufacture based on in-line sputtering.

The rate of hardening of the amalgam may be increased by increasing the temperature of the paste above ambient. Hardening may also be retarded by refrigeration, permitting storage of the amalgam in paste form. The hardened amalgam gains mechanical strength by the precipitation of intermetallic compounds.

Other aspects and advantages of the present invention can be seen on review of the drawings, the detailed description, and the claims which follow.

DETAILED DESCRIPTION OF THE INVENTION

Figure 1:
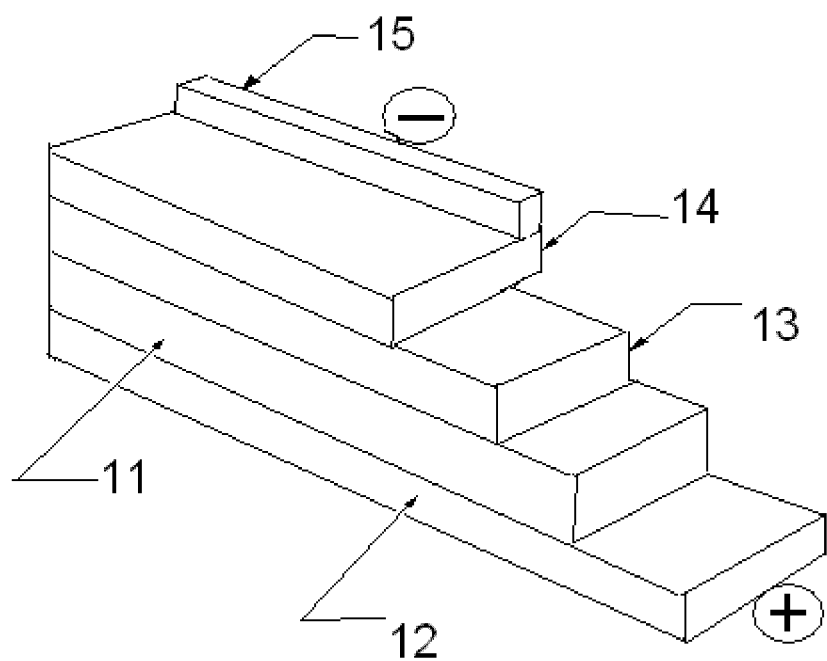
FIG. 1 is a cut away schematic view of the main layers in a CIGS solar cell stack

Our invention recognizes that the Group III-A metals indium and gallium (major components in CIGS compositions, Eqn 1) each have relatively low melting temperatures— indium at 154° C. and gallium at 29.8° C.—and further, that separately or in combination, they can be combined with Group I-B metals such as copper to form amalgams. The eutectic binary gallium-indium alloy composition (14 atomic percent indium or 22 wt. pct. indium) has a melt temperature of 14° C., thus offering the possibility of copper-indium-gallium amalgam formation at or below a nominal 25° C. ambient temperature. The present invention uses low-melting gallium and indium-gallium alloys to wet powders of solid metals such as copper to form an amalgam paste which will harden into a solid alloy. While the amalgam is in paste form, it is readily shaped or molded into sputter targets of any shape, including planar and cylindrical.

To our knowledge, amalgams have not been used previously to form sputter targets. In a recent US Patent Application [US 2011/0089030, herewith included as reference], Juliano et al. describe several proposed methods for adding CIG alloy to a sputter backing plate structure. Each of the methods proposed relies on high temperature casting or melting the ternary copper-indium-gallium CIG alloy. Juliano et al do not mention low temperature amalgam formation.

While low melting gallium has attracted attention as a component of amalgams for practical applications in dentistry and electronics, our invention is a novel application of amalgams in the field of thin film solar photovoltaics. As an example from the field of dentistry, gallium-silver-tin amalgams have been considered as a replacement for conventional mercury-silver tooth fillings which have lost favor because of concern for mercury bio-toxicity [S. M. Dunne, R. Abraham, C. L. Pankhurst, British Dental Journal, vol. 198 No. 6 (2005) p. 355-359, herewith included as reference]. In the field of electronics, gallium-copper alloy pastes have been considered as a replacement for lead-tin solder alloys [Bhattacharya, U.S. Pat. No. 6,554,923, herewith included as reference]. The paste-to-solid conversion permits a copper-gallium amalgam paste to fill a via-hole and become a solid microelectronic interconnection by hardening at 200° C.

Mechanical stirring and grinding of the liquid-solid mixture produces a paste as the liquid and solid phases react to form intermetallic compounds. A ceramic mortar and pestle is a well-established method for manually mixing and grinding together the amalgam chemicals. The amalgam paste hardens as the intermetallic compounds are produced by reaction between the liquid and solid phases. The rate of hardening can be controlled to permit sufficient time to form the amalgam paste into a desired shape.

It is generally agreed that the mechanism of amalgam formation begins with the wetting of the solid by the liquid phase. When grains of copper powder are wetted by liquid gallium near room temperature, intermetallic compounds begin to form at the liquid-solid interface. As the metals chemically diffuse together to form solid intermetallic compounds, the mechanical consistency of the mixture changes from paste-like to a solid metal alloy. The time for hardening can be shortened by increasing the mixing temperature and also by reducing the particle size of the solid metal. Reaction is also promoted by mechanical stirring of the paste mixture which promotes wetting by breaking through any thin oxide layer initially on the solid metal.

In the copper-gallium system, intermetallic solid phases $CuGa_2$ and $Cu_9Ga_4$ are formed at room temperature by the mixing of liquid gallium and copper powder [Kulikova, T. V. et al., Defect and Diffusion Forum, volumes 326-328 Diffusion in Solids and Liquids VII, pages 227-232, herewith included as a reference.] An intermetallic phase stable at room temperature that forms in the copper-indium system has the composition $Cu_7In_3$.

While the amalgam mixture is still in paste form between mixing and the onset of hardening, it can be spread on a surface or pressed into molds that define the desired target shape. Mechanical compaction of the amalgam paste during the mold filling process contributes to a dense pore-free target. The target assembly may be warmed to speed up the hardening reactions within the amalgam.

Figure 2:
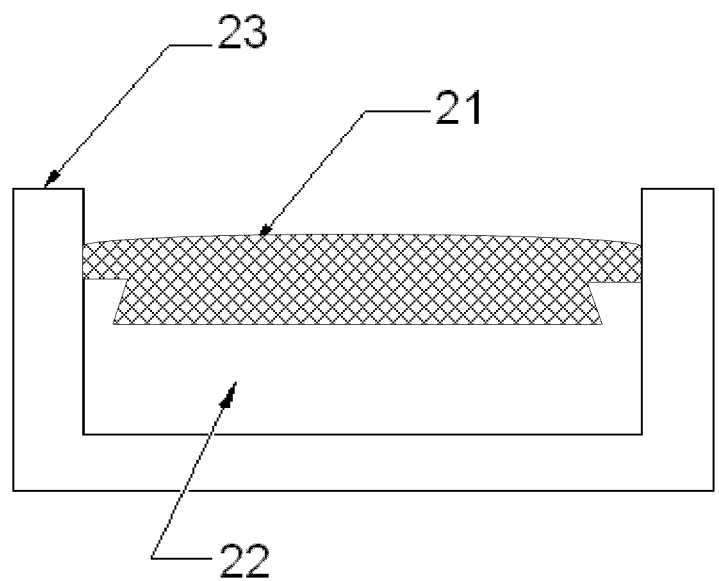
FIG. 2 is a schematic cross sectional view of amalgam loaded into a cavity in a planar backing plate positioned within a mold which defines the edges of the amalgam

The amalgam paste can be directly molded into a recess prepared in a planar copper backing plate, as shown schematically in cross-section in FIG. 2. Amalgam 21 is filled into and above the recessed step in 22. The recessed step has a slight inward tapering angle of from about 1 to 10 degrees to assist mechanical retention of the hardened amalgam. For clarity, the taper angle and dimension of the step in 22 are not drawn to scale in FIG. 2. Also for clarity, details such as power and cooling fittings of backing plate 22 are omitted from FIG. 2.

Mold 23 holds backing plate 22 in place during filling by amalgam 21. The sidewalls of 23 alloy amalgam 21 to be filled to a level substantially above the depth of the recessed cavity in 22. A thick target permits a longer time of target erosion before replacement of the target assembly is necessary, thus permitting more production time for substrate coating.

Figure 4:
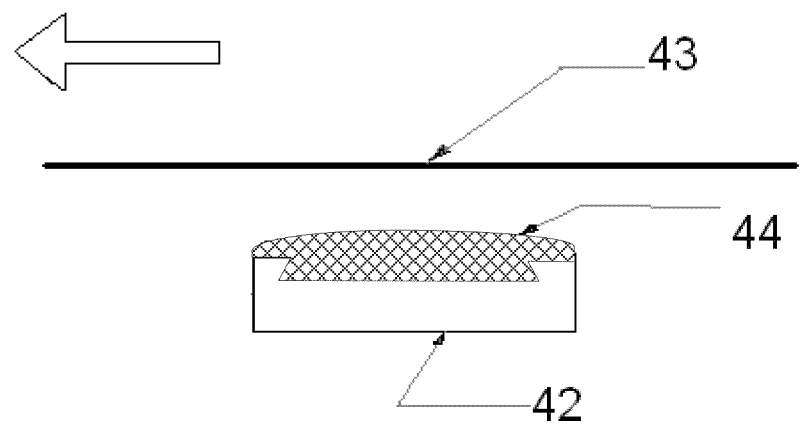
FIG. 4 is a schematic representation of an amalgam target in position for sputtering onto a substrate

Shown schematically in FIG. 4, a hardened paste amalgam target 41 and backing plate 42 combination represent one sputtering station in an in-line sequence of stations in a vacuum system, arranged to sputter a CIGS deposit upward to the bottom surface of continuous substrate 43 which moves past the sputtering station.

Figure 3:
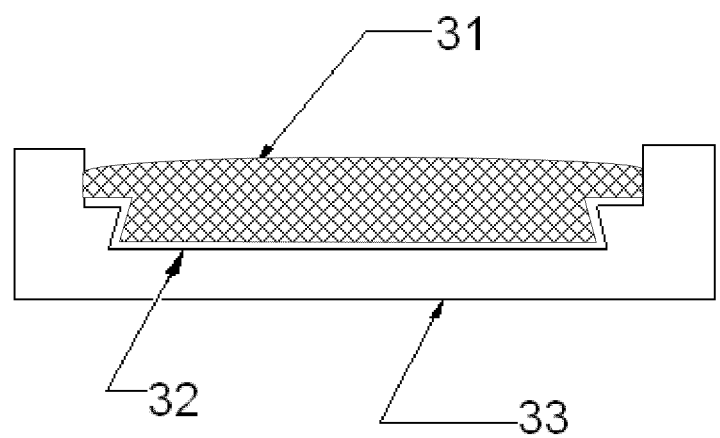
FIG. 3 is a schematic cross sectional view of amalgam loaded into a formed starting sheet which is solder-bonded to a backing plate

Those skilled in the practice of target construction will recognize that the thickness dimension of 22 in FIG. 2 may be reduced to represent a starting sheet shown schematically as 32 in FIG. 3. Starting sheet 32 is essentially a flat-bottomed thin metal tray with an inwardly angled step near its edges which fits into mold 33 (similar to 23 in FIG. 2). After hardening heat treatment of amalgam 31 in starting sheet 32, the combined hardened paste 31 and starting sheet 32 are extracted from mold 33 and the flat bottom of said sheet 32 is subsequently solder-bonded to a conventional backing plate similar to 22 in FIG. 2. Copper sheet is suitable for 32 and the use of starting sheets reduces the need for a large inventory of machined and outfitted backing plates 22 to serve as molds as shown in FIG. 2.

The paste cavity in both backing plate 22 and in starting sheet 32 are depicted schematically as undercut regions designed for the purpose of providing mechanical retention of the hardened paste to assist natural bonding between the copper fixtures 22 and 32 and the indium-gallium alloy in the CIGS amalgam. It will be apparent to one skilled in the art and technology of sputter targets that texturizing of the inner surface of the angled undercut region will further assist retention of the hardened paste. Texturing may consist of small grooves in the surface of the angle in contact with the paste in 22 or a pattern of mechanically formed shallow dimples on the undercut angled surface protruding into the paste in contact with 32. For clarity, FIGS. 2 and 3 are not drawn to scale and the actual undercut region will not be as deep as indicated. In operation, most of the hardened amalgam thickness will be available in the active sputter area. After target wear is pronounced and the assembly removed for reworking, the wear track may be refilled with paste and reheated to bond newly added paste to the original target material and to harden said newly added paste.

Figure 5:
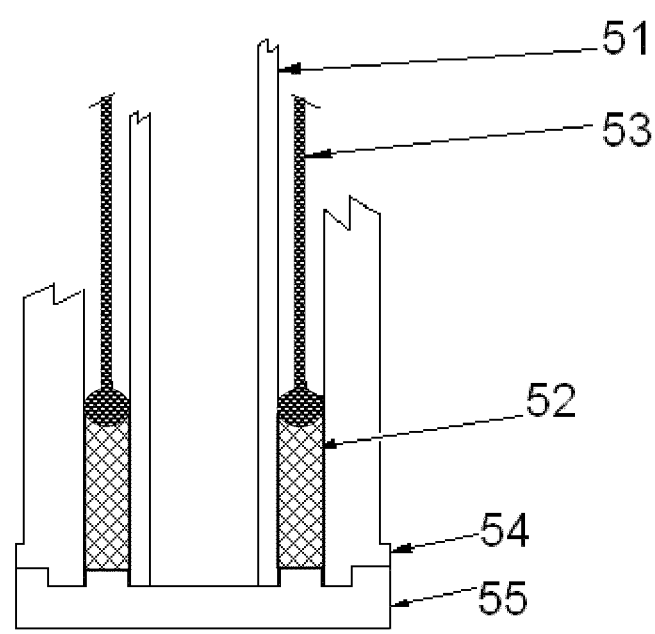
FIG. 5 is a schematic representation of means to pack amalgam into an annular space defined by an inner cylindrical backing plate and an outer coaxial tubular mold

In another embodiment, the amalgam paste may be molded directly onto a cylindrical backing plate, as shown schematically in cross section in FIG. 5. CIGS amalgam paste 52 is fed into the annular space between the cylindrical backing plate 51 and a coaxial cylindrical retaining mold 54, both held in alignment by the circular grooves in base plate 55. Circular tamping tool 53 is lifted from the annular space to permit fresh paste to be added. Compacting force applied to tool 53 will densify the paste. Between paste additions, the compacting tool structure will lift clear of the annulus for paste additions thus requiring a superstructure rig at least as high as twice the length of cylinder 51 plus fixtures to guide the return of tool 53 to the annulus. Adhesion of the tamped material will be assisted by texturizing the contacting surface of the backing cylinder and also by pre-coating said surface with a layer of solder material such as indium to promote bonding of cylinder to paste as hardening proceeds by thermal treatment. Retaining mold 54 may also be formed by assembling separate fitted sections to aid separation of 54 from compacted amalgam layer 52. Outer cylindrical mold 54 may be hinged vertically to open for removal of 51 when 52 has hardened or has sufficient green strength to permit handling. The tubular core backing cylinder 51 may be made of high strength copper alloy or stainless steel or aluminum alloy that can retain its rigidity for horizontal sputtering after exposure to any amalgam hardening temperatures.

Figure 6:
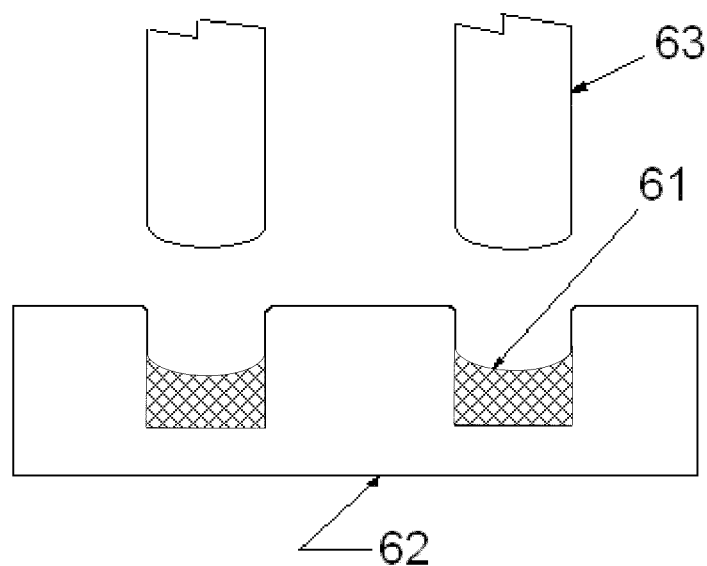
FIG. 6 is a schematic representation of a structure for packing amalgam into an annular cavity in a short mold to define rings of hardened amalgam that can be stacked and bonded on a central backing cylinder to form a cylindrical target.
Figure 7:
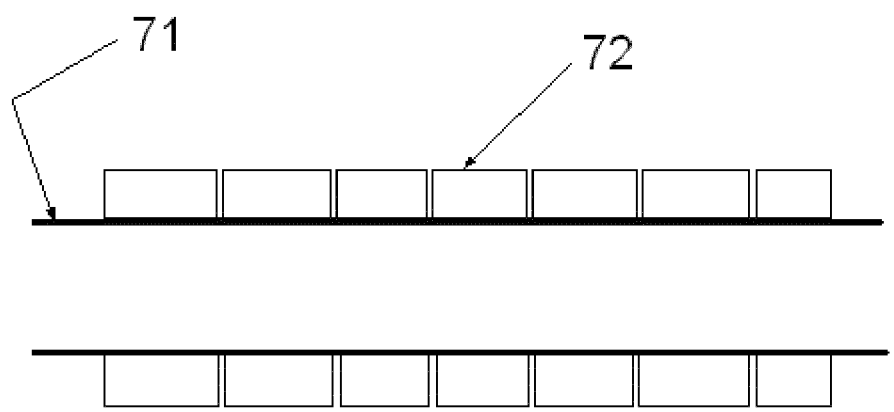
FIG. 7 is a schematic representation of a cylindrical target comprised of short tubular hardened amalgam ring segments.

In yet another embodiment, a long cylindrical target may be formed by stacking hardened amalgam rings in close contact along a backing cylinder. To form said rings, amalgam paste is shaped into circular segments with a hollow center, as shown schematically in cross-section in FIG. 6 (not to scale). Amalgam paste 61 is loaded into a ring cavity in mold 62 and becomes consolidated by pressure applied by the circular tamping tool 63. The consolidated amalgam paste 61 is removed from the mold after thermal hardening treatment provides sufficient green strength to the amalgam ring. Those skilled in the art will recognize that removal of consolidated amalgam ring 61 from mold 62 may be aided by pins (not shown) fitted in 62 beneath the ring cavity to lift the paste ring out of the cavity. Separation of 61 from 62 may also be aided by a lubricating layer applied to the cavity wall. As shown schematically in FIG. 7 (not to scale), the hardened amalgam ring segments 72 may be stacked along central cylindrical backing plate 71 and solder-bonded to each other and also to the cylinder to form a segmented elongated cylindrical sputter target.

Materials in powder or particulate form may be added and distributed throughout the semi-fluid amalgam mixture while the paste is being is stirred. For example, Group VI element selenium in powder form can be admixed into the paste. When the paste hardens, the incorporated selenium powder is available as a component of the target which can be sputtered along with the CIG metals of the target.

The compound forming reactions that produce hardening of the amalgam paste proceed in the range from near room temperature up to about 200° C. or greater and thus offer pathways to form CIG and CIGS sputter targets with reduced consumption of energy typically associated with conventional melting of alloys.

As discussed in Description of Prior Art, CIGS thin-film solar panel manufacturing methods presently tend to favor so-called reactive sputtering for the key absorber layer as the first stage of a two stage process. Separate metal targets serve to sputter copper, indium and gallium onto a substrate in a selenium-bearing atmosphere to form separate layers of chalcogenide compounds. The addition of separate selenized layers onto the substrate is followed by a second stage, namely heating to diffuse together the metal chalcogenide layers. In the second stage, the sputtered layers are also exposed to a selenium-bearing gas to compensate for any loss of selenium during the blending heat treatment which diffusively blends the solid layers into the ternary CIGS chalcogenide.

Taking into account the overall complexity of the presently used two stage method as described in U.S. Pat. No. 6,518,086 and U.S. Pat. No. 8,048,707, our invention is a most desirable step towards improved manufacturability of CIGS solar panels by providing the ability to sputter all three absorber metals from one target. These CIG metals could be selenized during the deposition process as is done presently with, however, the advantage of a single metal alloy target already mixed to include sodium, aluminum and sulfur additives, if desired. Briefly stated—one target for one sputtered CIGS absorber layer.

Our invention can provide an even more preferable target that is comprised of all ingredients necessary to form the complete CIGS composition. Such a target would contain copper, indium and gallium either already combined completely or partially with selenium in the form of selenide compounds. Group VI-A elements such as selenium and tellurium can be admixed into the CIG metal amalgam while it is a freshly formed paste, before hardening reactions commence. As mentioned, desirable additive elements such as sulfur, aluminum and sodium can also be incorporated into the amalgam paste.

For manufacturing both CIG and CIGS targets, all process steps can be at low temperature, preferably close to ambient temperature. Low temperature processing simplifies the choice of materials of construction for handling, mixing and target mold equipment and also minimizes the contamination of the target chemicals from impurities transferred from such equipment.

Amalgam mixtures of the present invention also offer several advantages for low temperature formation of target material, listed as follows:

a) Amalgam compound components can be mixed in equipment outside of the sputtering system, thus freeing the sputter chamber from the task of building separate layers that must then be blended by heat treatment.

b) Relatively simple techniques and equipment such as mortar and pestle or ball milling and the like may be used to prepare and mix the components of the desired CIG or CIGS chemistry.

c) Additives to the amalgam paste can be readily admixed and distributed throughout the amalgam during paste mixing, affording a means for close control of the target composition. Group VI elements or IB-VIA or IIIA-VIA compounds or sulfur-bearing compounds, sodium-bearing compounds and aluminum can be added as powders which become uniformly distributed throughout the amalgam paste during mixing. These compounds or elements may not participate directly in the amalgam hardening mechanism but they will become totally encapsulated as the amalgam hardens. The incorporated additive materials in the composite target will be sputtered in addition to the hardened amalgam matrix of CIG metals. It is thus possible to generate a sputter product that contains at least a part of the required Group VIA element that forms the CIGS ternary chalcogenide. Sputtering from a hardened pre-mixed composite amalgam target of fixed pre-determined composition affords an extra degree of reproducibility and control of the desired chemistry of the sputtered absorber layer.

d) Temperatures near ambient for amalgam mixing and heat treatment for hardening minimize the loss of any volatile components such as selenium. In addition, mixing at temperatures between 15° C. and about 160° C. can be accomplished in the open air without the need for vacuum equipment since oxidation of CIG metals is greatly reduced. Hardening at temperatures from 25° C. to about 200 or 300° C. can also be accomplished in non-vacuum ovens since only the surface of the formed and shaped paste is exposed to the air.

e) The rate of amalgam hardening can be accelerated by a modest increase in temperature. Typically, temperatures known to promote reaction are in the range of 50° C. to 200° C. For example, Baldwin et al. [U.S. Pat. No. 5,672,913, herewith included as reference] teach amalgam mixtures of gallium with 11 wpercent. pct. aluminum and also gallium with 21.4 wt. pct. copper plus 3.6 wt. pct. nickel for electronic circuit board fabrication that harden after several days at room temperature or within a few hours at higher temperatures ranging to 150° C.

f) The ability of amalgam mixtures to harden at ambient or slightly greater temperatures is beneficial with regard to the inclusion of powder materials in the amalgam paste which could possibly react at higher temperatures. From a general thermochemistry viewpoint, a chalcogenide compound (as represented by the general formula in Eqn 1) is a stable compound and may form in a vigorous heat-evolving reaction when a mixture of its components is thermally activated. The potential to react vigorously under the right conditions may be inherent, but the kinetic rate of reaction between solids is negligible at ambient temperatures. A Group VI element such as selenium in powder form mixed with copper or indium also in powder form will react to form chalcogenide compounds at high temperature but both can co-exist in a stable condition under ambient conditions as components of a composite amalgam sputter target. It is also noted that the intermetallic compounds first formed in the amalgam paste between Group I-A (copper) and Group III-A (gallium, indium) metals at ambient temperature essentially reduce the chemical activity for reactions of each metal at higher temperatures.

g) As with all sputter targets, good thermal conductivity is required in order for cooling to dissipate heating from the electrical energy applied for the sputter process. Good electrical conductivity is also required for minimal resistive heating in the target material. In general, intermetallic compounds are good electrical conductors and good thermal conductivity may also be expected. The composition of the hardened amalgam targets of the present invention can be controlled to form a composite alloy metallurgical structure with intermetallic particles surrounded by a matrix of metal to enhance both overall electrical and thermal conductivity.

h) The well-known Thornton structure zone diagram relates sputtered deposit morphology with parameters of gas pressure and substrate temperature, reviewed recently by Anders. [Anders, A., Thin Solid Films, vol. 518, issue 15, 2010, pages 487-490, herewith included as reference]. Work has also been directed to understanding the influence of the composition, metallurgical and crystalline structure of the target on the composition of the deposit. On occasion, the composition of the deposit may not match the composition of the target. Kailasam et al. [U.S. Pat. No. 6,709,557, herewith included as reference] discuss a problem where scattering of magnesium atoms traveling from target to deposit causes a sputtered magnesium-copper alloy to have a lower magnesium content than in the cast target. Kailasam et al. obtain the desired high magnesium content in a copper-magnesium deposit by constructing a target with large sectors of each pure metal inlaid in a pattern. Of interest to the present invention, by analogy to the teaching of Kailasam et al., a target comprised of microscopic particles of a compound phase within a matrix phase should yield a deposit of the same average composition. The composition of the amalgam of the present invention can be readily tested and adjusted to compensate for a component that needs to be in greater amount in order to match the required composition of the deposit.

i) The mechanism of sputtering from targets which are compounds requires that bonds be broken by the impact of argon ions which penetrate and disrupt the crystal structure. It is thought that atom sized fragments of a target are ejected in the sputter process rather than individual target atoms. For example, aluminum oxide sputtered from an aluminum oxide ($Al_2O_3$) target is not decomposed into component aluminum and oxygen by the argon ion impact. Oxygen atoms probably travel to the deposit while still bonded to aluminum atoms in what must be a small atom-sized fragment which serves as a "building block" for growing the sputtered aluminum oxide deposit. Accordingly, as shown in Example 1, a hardened amalgam formed from 70 wt. pct. copper and 30 wt. pct. gallium contains copper metal with gallium principally in a copper gallide ($CuGa_2$) compound phase. Sputter action may detach atomic size fragments of copper gallide from the target which may then transfer to the deposit. When the deposit is heated in a selenium atmosphere, the copper gallide phase will be selenized to form the final stable product, copper gallium selenide.

EXAMPLES

There follow examples of the application of the present invention to the formation of amalgams and the hardening of said amalgams. Those skilled in the art will recognize that the size of the samples is for experimental convenience and is not a limiting factor to the formation of sputter targets with greater dimensions.

Example #1

Example #1 is an amalgam comprised of copper and gallium hardened at 103° C. A circular tablet of 70 wt. pct. copper-30 wt. pct. gallium alloy was prepared by mixing copper powder together with gallium melted in a porcelain mortar warmed to 50° C. on a temperature controlled electrical hot plate. The heated mixture was manually stirred with a porcelain pestle for five minutes. The resulting paste was removed from the mortar with a small flat stainless steel spatula and was packed into a 25 mm diameter circular cavity formed in a 6 mm thick Delrin polymer slab. The tablet was heated in air for 147 hours at 77° C. followed by a step in temperature to 103° C. for 16 hours, then cooled to 25° C. at an initial rate of 4 C degrees per minute. The hardened amalgam tablet was mechanically sound.

The copper powder (Fisher Scientific) particles were essentially spherical with 36 percent smaller than 40 micron and 64 percent distributed evenly in a range of diameters from 40 to 240 micron, as measured on SEM photos of the powder.

Figure 8:
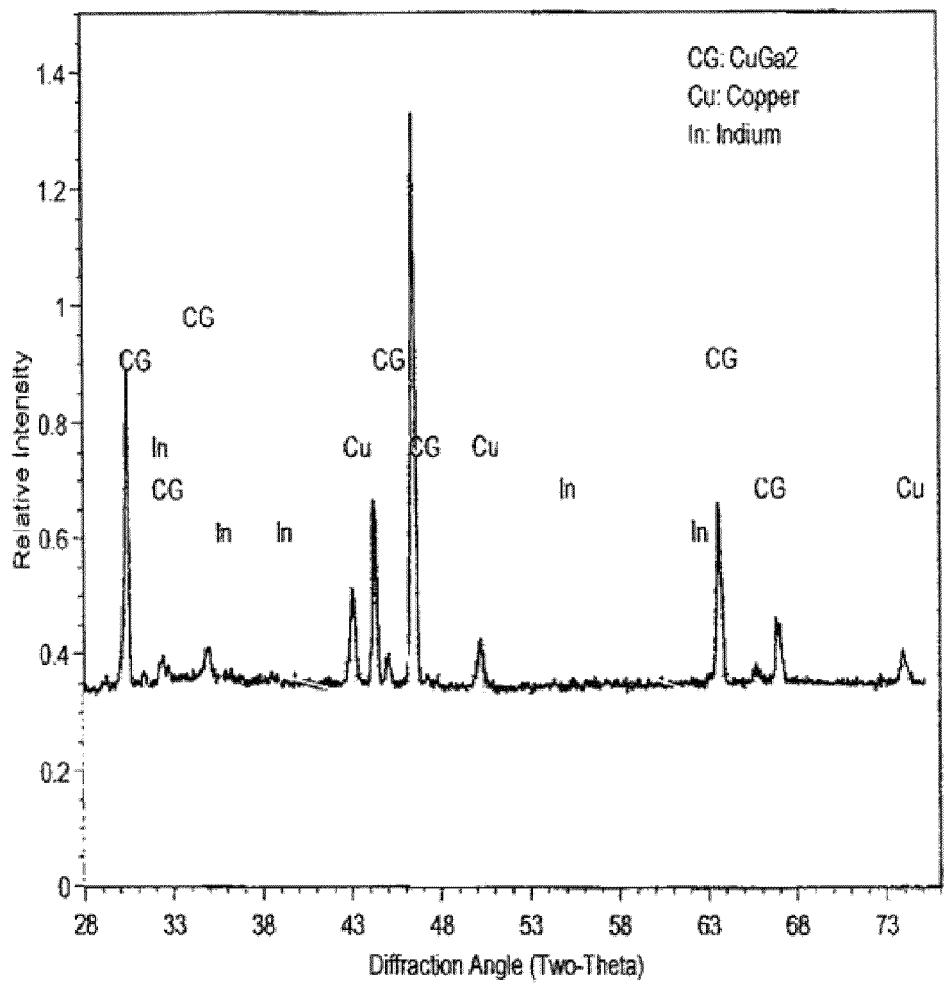
FIG. 8 is an X-ray diffraction plot for Sample 1—amalgam of copper and gallium hardened at 103° C. showing major presence of copper gallide $CuGa_2$ intermetallic phase

As shown in FIG. 8, X-ray diffraction (XRD) indicates $CuGa_2$ to be a major phase together with metallic copper. The XRD pattern show that no free uncombined metallic gallium remains in the hardened amalgam. The flat surface of the hardened tablet was scanned from 25 to 75 two-theta degrees with copper K-alpha radiation. The resulting pattern was matched against reference standards stored in the JCPDS database.

Figure 9:
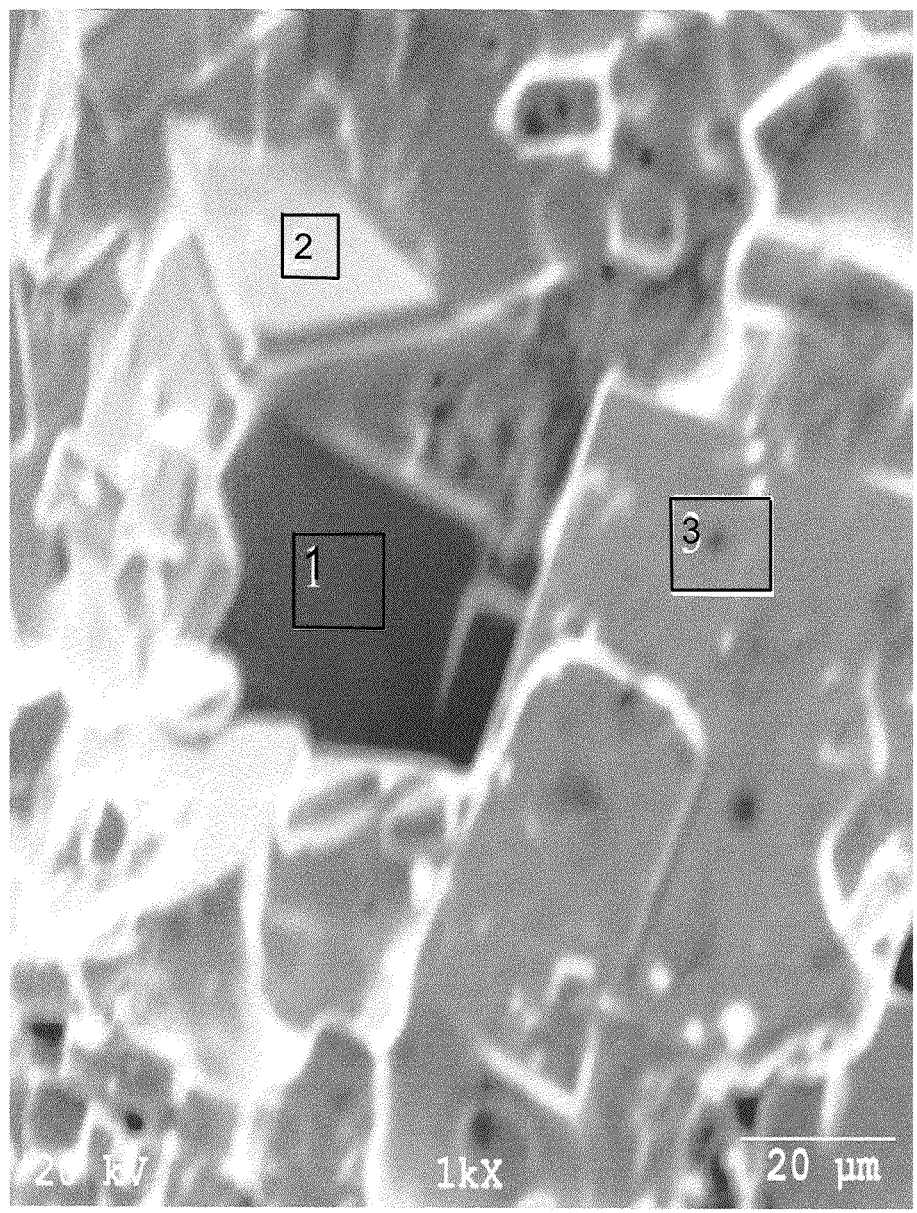
FIG. 9 is a scanning electron microscope (SEM) photo at 1000× of $CuGa_2$ platelets in Sample 1 with atom percentages of copper and gallium determined by energy dispersive X-ray spectroscopy (EDS).

A scanning electron microscope (SEM) view of the tablet surface at 1000× (FIG. 9) shows a structure containing flat platelets. EDS scans focused in the three regions designated as 1, 2 and 3 in FIG. 9 each show a composition close to 66 atom percent gallium, 33 atom percent copper, corresponding to $CuGa_2$ and a good match with the XRD results shown in FIG. 8.

Example 1 shows that a binary copper-gallium alloy can be made by the amalgam method of this invention with gallium in compound form available for sputtering along with copper. The mixing and hardening of the alloy was accomplished in the temperature range from 30° C. to 103° C. The platelets of $CuGa_2$ act to mechanically strengthen the hardened mixture. The alloy tablet has a low electrical resistance, measured as 3.0 ohm with point probes positioned on opposite sides of the 6 millimeter thick tablet. The copper metal phase in the hardened mixture also contributes to both electrical and thermal conductivity.

In contrast to the low temperature amalgam method of our invention, Huang and Tu [Huang, Wei-Chihn and Tu, Cheng-Hsin, European Patent Application EP 2182083A1, filed 11 Apr. 2008, incorporated herewith as a reference] melted metals in a conventional high temperature vacuum system to produce copper-gallium alloy with a composition that matches the 70 wy. pct. copper-30 wt. pct. gallium of our Example 1. It is noted that the melting temperature of copper is 1083° C. As reported by Huang and Tu, the cast alloy had a copper-gallium intermetallic compound dispersed in a copper matrix, requiring mechanical deformation and heat treatment at temperatures up to 800° C. for several hours to produce a distribution of phases best suited for target operation.

Our invention offers the opportunity to control phase distribution and to minimize porosity by optimization of copper particle size distribution and hardening time and temperature. Amalgam hardening temperatures in the range from 25° C. to about 200° C. permit conservation of energy input to the target forming process in contrast to the conventional high temperature metallurgical method described by Huang and Tu, Example #2

Example #2 is a hardened amalgam containing all three CIG components: copper, indium and gallium. A copper-indium-gallium alloy of composition 63.7 wt. pct copper, 27.3 wt. pct. gallium and 9 wt. pct. indium was prepared by first warming 2.3 grams of indium pellets with 7 grams of gallium in a porcelain mortar maintained at 80° C. to form the eutectic composition (about 22 wt. pct. indium). The mortar temperature was raised to 93° C. and 16.3 grams of copper powder was added to the liquefied gallium-indium eutectic.

The copper was mixed manually with the liquid eutectic for three minutes. The resulting amalgam paste mixture was tamped into a circular cavity in a Delrin mold and maintained at 93° C. for 20 hours, cooled slowly to room temperature over a period of two hours followed by reheating to 77° C. for 125 hours, then to 103° C. for 16.5 hours, and then cooled slowly to room temperature at an initial rate of 4 C degrees per minute. The hardened amalgam had good green strength. The alloy tablet had a low electrical resistance, measured as 2.9 ohm with point probes positioned on opposite sides of the 6 millimeter thick tablet.

X-ray diffraction peak positions and intensities are listed in Table 1 for powder collected from a saw cut through the 6 millimeter thickness of the Example 2 hardened tablet. The XRD pattern was obtained with copper K-alpha radiation scanned over a two-theta angle from 25 to 75 degrees and was compared with database standards. Both metallic copper and metallic indium are present whereas gallium has reacted with copper to form the intermetallic compound $CuGa_2$. Example 2 shows that our invention can produce a hardened amalgam containing all three CIG metals copper, indium and gallium in a form usable as a sputter target. The interaction of gallium with copper to form the compound $CuGa_2$ makes the gallium available for sputtering along with metallic copper and indium from a single target.

TABLE 1

Peak Positions and Intensities for Example 2 (powdered) sample

| Two-Theta | D Spacing | Intensity | Phases |
|---|---|---|---|
| 30.5 | 2.93 | 10 | $CuGa_2$ |
| 31.4 | 2.84 | 20 | $CuGa_2$ |
| 32.8 | 2.73 | 12 | In |
| 35.1 | 2.56 | 45 | $CuGa_2$ |
| 36.1 | 2.49 | 5 | Cu |
| 39.1 | 2.31 | 5 | In |
| 43.1 | 2.10 | 12 | In |
| 44.4 | 2.04 | 100 | $CuGa_2$ |
| 45.1 | 2.01 | 40 | $CuGa_2$ |
| 46.5 | 1.95 | 12 | $CuGa_2$ |
| 50.3 | 1.82 | 7 | Cu |
| 54.3 | 1.69 | 5 | In |
| 55.5 | 1.66 | 5 | $CuGa_2$ |
| 63.1 | 1.47 | 5 | Cu |
| 63.7 | 1.46 | 5 | $CuGa_2$ |
| 65.8 | 1.42 | 10 | $CuGa_2$ |
| 66.9 | 1.40 | 10 | $CuGa_2$ |
| 74.1 | 1.28 | 7 | Cu |

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method comprising:
combining a liquid metal comprising one of indium, gallium and an indium-gallium mixture, with a solid metal comprising copper in divided form, and mechanically mixing the combined liquid and solid metals at a temperature between 14° C. and 160° C. so that the liquid metal wets the solid metal to form a semi-liquid amalgam paste; and
forming a sputter target by molding the semi-liquid amalgam paste, which hardens including formation of an intermetallic compound into a form suitable for use as a sputter target.

2. The method of claim 1, including performing said mixing using an apparatus to mix the solid metal and the liquid metal and promote wetting of the solid metal by the liquid metal.

3. The method of claim 1, wherein the solid metal is copper in the form of powder.

4. The method of claim 1, further including:
loading the amalgam paste into a shaped mold cavity;
hardening the amalgam paste in the shaped mold cavity into said form suitable for use as a sputter target.

5. The method of claim 4, wherein the shaped cavity mold is formed in a structure of copper or aluminum alloy or stainless steel, the structure containing the amalgam paste during baking treatment for hardening and wherein said structure thereafter serves as the backing plate for the sputtering target, said backing plate including connections to provide electrical power, internal channels for the passage of cooling fluid and vacuum seals for attachment to a vacuum chamber.

6. The method of claim 4, wherein the shaped cavity mold is a flat tray structure comprised of a thin metal sheet of copper, aluminum alloy or stainless steel, the shaped cavity mold containing the amalgam paste during baking treatment for hardening and thereafter serving as a starting sheet, a flat bottom of the flat tray structure being bonded to a backing plate with a solder material.

7. The method of claim 4, wherein a cylindrical sputter target is constructed by loading the amalgam paste into the shaped mold cavity, the shaped mold cavity including an annular space formed between outer and inner concentric cylinders, an outer surface of the inner cylinder being the backing surface for the sputtering target, an outer coaxial tube forming the outer cylinder, the outer coaxial tube being removable when the amalgam paste has hardened sufficiently to form the sputter target, the sputter target in bonded combination with the inner cylinder backing plate.

8. The method of claim 4 wherein a cylindrical sputter target is formed by stacking a plurality of short ring-shaped segments, the short ring-shaped segments being made by loading the amalgam paste into the shaped mold cavity, the shaped mold cavity being a short annular mold that is used to create each of the short ring-shaped segments, the short ring-shaped segments after being separated from the shaped mold cavity are then fitted onto a central tubular backing cylinder to form a stack of a multiplicity of short ring-shaped segments that form the cylindrical sputter target, the cylindrical sputter target assembled by heating to form a solder bond between surfaces of contact between adjacent rings and a solder bond between surfaces of contact between the outer surface of the central metal backing cylinder and the inner surfaces of the short ring-shaped segments.

9. The method of claim 1, wherein said combining comprises mixing liquid gallium, copper in the form of powder, shot, granules or pieces and indium in the form of powder, shot, granules or pieces.

10. The method of claim 1, wherein said combining comprises combining components of a CIG alloy including copper, gallium and indium and selenium in the form of powder, shot, granules or pieces.

11. The method of claim 1, wherein said mixing comprises mixing components of a CIG alloy including copper, gallium and indium, and selenide compounds of copper, indium, gallium or combinations thereof in the form of powder, shot, granules or pieces.

12. The method of claim 1, including admixing materials including sodium, sulfur or aluminum in element or compound form, the materials in the form of powder, shot, granules or pieces, to the semi-liquid amalgam paste.

13. The method of claim 1, including admixing sulfur-containing compounds of copper, indium, gallium or combinations thereof, in the form of powder, shot, granules or pieces, to the semi-liquid amalgam paste.

14. The method of claim 1, including admixing aluminum-containing alloys or compounds of copper, sodium, indium, gallium, sulfur, selenium or combinations thereof, in the form of powder, shot, granules or pieces, to the semi-liquid amalgam paste.

15. The method of claim 1, including admixing sodium-containing alloys or sodium-containing compounds of copper, indium, gallium, selenium, sulfur, aluminum or combinations thereof, in the form of powder, shot, granules or pieces, to the semi-liquid amalgam paste.

16. A method comprising:
   combining a solid metal or metals comprising copper in divided form, and a liquid metal or metals, comprising an indium-gallium mixture, and mechanically mixing the combined liquid and solid metals to form a semi-liquid amalgam paste at a temperature between 14° C. and 160° C., the amalgam paste comprising copper, indium and gallium;
   shaping the semi-liquid amalgam paste which hardens including formation of an intermetallic compound into a sputter target; and
   attaching or fitting the sputter target to a backing plate.

17. The method of claim 16, including admixing selenium to the semi-liquid amalgam paste.

* * * * *